United States Patent [19]
Raimi et al.

[11] Patent Number: 5,680,332
[45] Date of Patent: Oct. 21, 1997

[54] MEASUREMENT OF DIGITAL CIRCUIT SIMULATION TEST COVERAGE UTILIZING BDDS AND STATE BINS

[75] Inventors: Richard Raimi; Carl Pixley, both of Austin, Tex.

[73] Assignee: Motorola, Inc., Schaumburg, Ill.

[21] Appl. No.: 540,686

[22] Filed: Oct. 30, 1995

[51] Int. Cl.$^6$ .................................................. G06F 17/50
[52] U.S. Cl. ........................................... 364/578; 364/488
[58] Field of Search ...................................... 364/488, 489, 364/578

[56] References Cited

U.S. PATENT DOCUMENTS

| | | | |
|---|---|---|---|
| 5,278,769 | 1/1994 | Bair et al. | 364/490 |
| 5,331,568 | 7/1994 | Pixley | 364/489 |
| 5,394,347 | 2/1995 | Kita et al. | 364/578 |
| 5,517,432 | 5/1996 | Chandra et al. | 364/578 |
| 5,537,580 | 7/1996 | Giomi et al. | 364/489 |
| 5,539,680 | 7/1996 | Palnitkar et al. | 364/578 |
| 5,594,656 | 1/1997 | Tamisier | 364/488 |

OTHER PUBLICATIONS

C. Pixley, "A Computational Theory and Implementation of Sequential Hardware Equivalence", DIMACS Series in Discrete Mathematics and Theoretical Computer Science, vol. 3, 1991, pp. 293–320.

H. Cho et al., "ATPG Aspects of FSM Verification", Proceedings of the IEEE International Conference on Computer-Aided Design, pp. 134–136, Nov. 1990.

(List continued on next page.)

*Primary Examiner*—Vincent N. Trans
*Attorney, Agent, or Firm*—Bruce E. Hayden

[57] ABSTRACT

Measurement of the test coverage of digital simulation of electronic circuitry is obtained (54). A Composite Circuit Model (60) has two parts: a Target Circuit Model (64) and an Environment Circuit Model (62). The Environment Circuit Model (62) models the behavior of inputs to the Target Circuit (64). The Composite Circuit Model (60) is translated into implicit FSM representations utilizing BDDs. A State Bin Transition Relation is formed which represents allowable transitions among user-specified sets of states or State Bins, and a representation of the reachable State Bins is built (94). A comparison is made (102) between data accumulated over one or more simulations (40) of the Target Circuit (64) and the data contained in the State Bin Transition Relation and the representation of the reachable State Bins. Output (52) is then generated showing which sets of circuit states were and weren't visited and which transitions allowed by the State Bin Transition Relation were and weren't taken during the simulations.

27 Claims, 6 Drawing Sheets

OTHER PUBLICATIONS

Hiroaki Iwashita et al., "Automatic Test Program Generation for Pipelined Processors", IEEE/ACM International Conference on CAD–94, Nov. 6–10, 1994, pp. 580–583.

David E. Long, "Model Checking, Abstraction, and Compositional Verification", submitted to the Thesis Committee at the School of Computer Science, Pittsburgh, PA, Jul. 1993, pp. 131–141.

Randal E. Bryant, "Graph–Based Algorithm for Boolean Function Manipulation", IEEE Transactions On Computers, vol. C–35, No. 8, Aug. 1986, pp. 655–691.

Randal E. Bryant, "Symbolic Boolean Manipulation with Ordered Binary–Decision Diagrams", ACM Computing Surveys, vol. 24, No. 3, Sep. 1992, pp. 293–318.

Karl S. Brace et al., "Efficient Implementation of a BDD Package", 1990 27th IEEE/ACM Design Automation Conference, Paper 3.1, pp. 40–45.

Richard Rudell, "Dynamic Variable Ordering for Ordered Binary Decision Diagrams", IEEE/ACM International Conf. On CAD–93, Nov. 7–11, 1993, pp. 42–47.

Hyunwoo Cho et al., "Synchronizing Sequences and Symbolic Traversal Techniques in Test Generation", Journal of Electronic Testing:Theory and Applications, 4, 19–31 (1993), pp. 19–31.

Jerry R. Burch, et al., "Symbolic Model Checking for Sequential Circuit Verification", IEEE Transactions on Computer–Aided Design of Integrated Circuits and Systems, vol. 13, No. 4, Apr. 1994, pp. 401–424.

Olivier Coudert et al., "Verification of Sequential Machines Using Boolean Functional Vectors", Formal VLSI Correctness Verification, Elsevier Science Publishers, The Netherlands, 1990, pp. 179–197.

J.R. Burch et al., "Representing Circuits More Efficiently in Symbolic Model Checking", 1991 28th ACM/IEEE Design Automation Conference, Paper 24.3, pp. 403–407.

E.Clarke et al., "Efficient Generation of Counterexamples and Witnesses in Symbolic Model Checking", SRC Pub. C94564, Contract 94–DJ–294, Nov. 1994, pp. 1–15.

E.M. Clarke et al., "Automatic Verification of Finite–State Concurrent Systems Using Temporal Logic Specifications", Apr. 1986 ACM Transactions on Programming Languages and Systems, vol.8, No.2, pp. 244–263.

Sharad Malik et al., "Logic Verification using Binary Decision Diagrams in a Logic Synthesis Environment", IEEE International Conference On Computer–Aided Design, Nov.7–10, 1988, pp. 6–8.

MEASUREMENT OF DIGITAL CIRCUIT SIMULATION TEST COVERAGE UTILIZING BDDS AND STATE BINS

CROSS REFERENCE TO RELATED APPLICATION

This application is related to our copending patent application Ser. No. 08/199,433 entitled "A METHOD AND APPARATUS FOR PROVIDING TEST COVERAGE ESTIMATION FOR AN ELECTRICAL CIRCUIT", filed Feb. 22, 1994 and assigned to the assignee hereof.

This application is related to our copending patent application Ser. No. 08/447,865 entitled "METHOD AND APPARATUS UTILIZING MANIPULATION AND REACHABILITY ANALYSIS OF IMPLICIT REPRESENTATIONS OF FINITE STATE MACHINES FOR GENERATING SIMULATION INPUT VECTOR SEQUENCES FOR CIRCUITS", filed May 23, 1995 and assigned to the assignee hereof.

FIELD OF THE INVENTION

The present invention generally relates to testing circuits, and more specifically to measuring coverage obtained by digital simulation of a circuit implementing a Finite State Machine.

BACKGROUND OF THE INVENTION

Temporal logic model-checking, which is a method for proving that a temporal logic formula is valid for a given Finite State Machine (FSM), has been implemented utilizing symbolic BDD representations of sets of states and state transition relations, and utilizing such symbolic representations to perform reachability analysis and Finite State Machine (FSM) transversal. One example of this is described in the an article by E. Clarke, O. Grumberg, K. McMillan, X. Zhao titled *"Efficient Generation of Counter Examples and Witnesses in Symbolic Model Checking"*, Semiconductor Research Corporation, Publication Number C94564, November, 1994. The above cited article by E. Clarke et al. provides a method for proving the validity, or lack thereof, of temporal logic formulae. It however provides no measurement of the coverage obtained during a series of circuit simulations.

IBM Corporation has a functional simulation coverage program called TCE. However, this program is directed towards measuring the coverage of combinational logic, and uses explicit, rather than symbolic, means of Boolean function representation. IBM does have another program that monitors simulation coverage of state machines. But this second program expects a designer to input the description of the machine, and it limits itself to tracking the rather small state machines that designers can describe explicitly, not the huge product machines, often running into trillions of states, that the invention described herein is capable of analyzing utilizing implicit representations.

U.S. patent application Ser. No. 08/199,433 filed Feb. 22, 1994 by applicant herein Richard Raimi entitled "A METHOD AND APPARATUS FOR PROVIDING TEST COVERAGE ESTIMATION FOR AN ELECTRICAL CIRCUIT" outlines a method of estimating simulation coverage. That invention relies upon injection of new code into an HDL description of an electrical circuit in order to monitor circuit activity during simulation. It does not teach a means of analyzing the reachable states or allowable state transitions of a Finite State Machine implemented as an electrical circuit. It also does not teach a means of partitioning the state space of a FSM implemented as an electrical circuit. Finally, it does not teach a means of representing Boolean functions and sets of states in implicit form.

U.S. patent application Ser. No. 08/447,865 filed May 23, 1995 by both applicants herein entitled "METHOD AND APPARATUS UTILIZING MANIPULATION AND REACHABILITY ANALYSIS OF IMPLICIT REPRESENTATIONS OF FINITE STATE MACHINES FOR GENERATING SIMULATION INPUT VECTOR SEQUENCES FOR CIRCUITS" teaches the usage of implicit FSM representations such as BDDs and reachability analysis for generating Simulation Vector sequences. It utilizes a Composite Circuit Model comprised of a Target Circuit Model and an Environment Circuit Model. The invention does not address simulation vector coverage, nor does it utilize State Bins.

SUMMARY OF THE INVENTION

In accordance with the invention, measurement of the test coverage of digital simulation of electronic circuitry is obtained. A Composite Circuit Model has two parts: a Target Circuit Model and an Environment Circuit Model. The Environment Circuit Model models the behavior of inputs to the Target Circuit. The Composite Circuit Model is translated into implicit FSM representations utilizing BDDs. A State Bin Transition Relation is formed which represents allowable transitions among user-specified sets of states or State Bins, and a representation of the reachable State Bins is built. A comparison is made between data accumulated over one or more simulations of the Target Circuit and the data contained in the State Bin Transition Relation and the representation of the reachable State Bins. Output is then generated showing which sets of circuit states were and weren't visited and which transitions allowed by the State Bin Transition Relation were and weren't taken during the simulations.

These and other features, and advantages, will be more clearly understood from the following detailed description taken in conjunction with the accompanying drawings. It is important to point out that there may be other embodiments of the present invention which are not specifically illustrated.

DETAILED DESCRIPTION OF A PREFERRED EMBODIMENT

Figure 1:
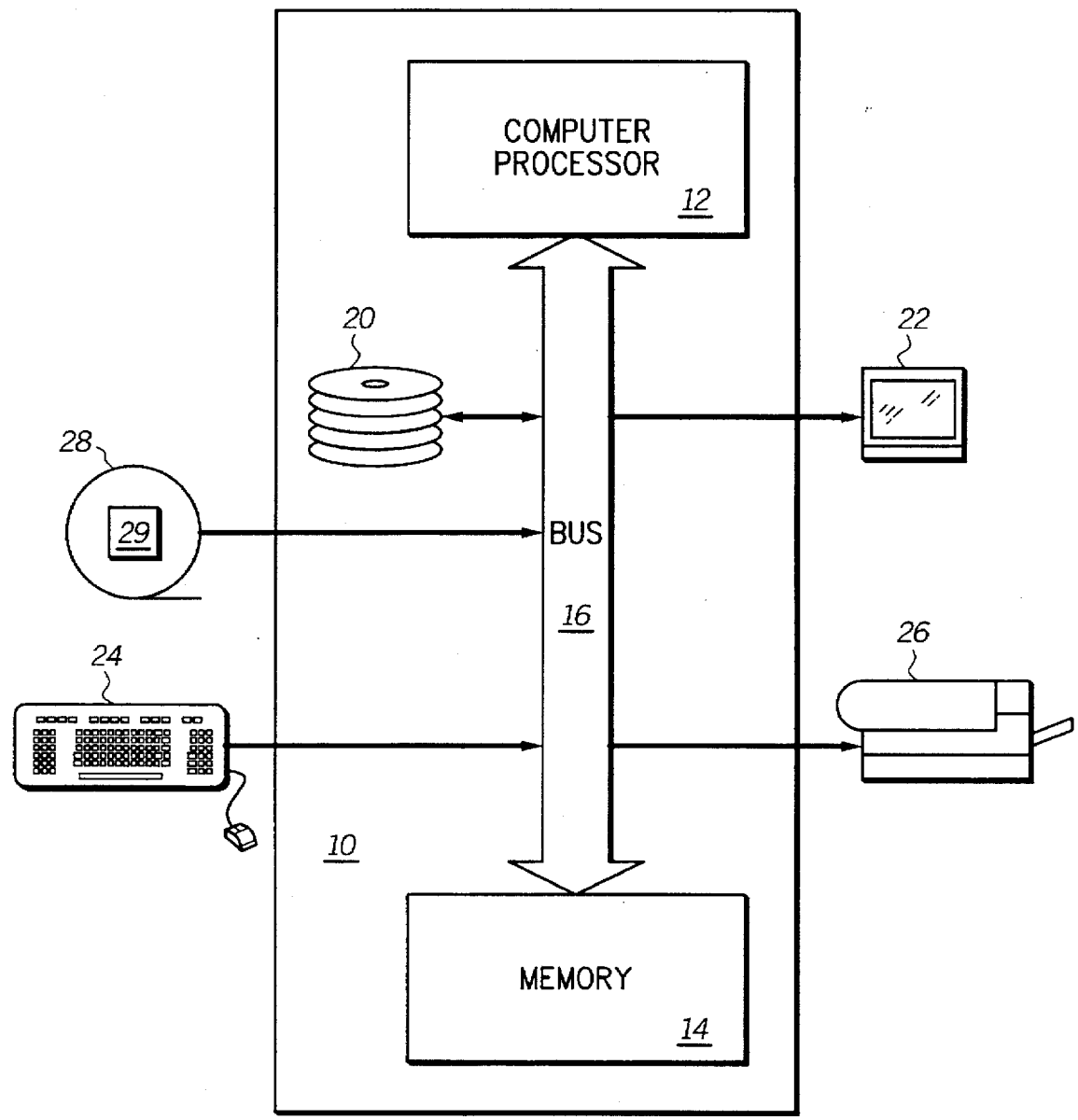
FIG. 1 is a block diagram showing the hardware components of the present invention.

This invention offers a unique contribution to what is termed Functional Verification in VLSI (Very Large Scale Integration). Functional Verification denotes a procedure for determining that a design conforms to its specification.

Digital simulation is the most common functional verification technique for digital circuits. A digital simulator is a program which determines the values of digital circuit nodes given a user-supplied initial state of the circuit, and a user-supplied sequence of circuit inputs. Such a simulator produces a Simulation Trace, which is a record of the specific sequences of inputs, outputs and/or internal circuit nodes simulated. The events in the simulator model the events that would occur in the actual circuit, in a real operating environment.

A shortcoming in many current VLSI design methodologies is the lack of any means to measure the functional coverage given by digital simulation. Simulation Coverage Measurement, in this context, refers to the following: Given a definition of the set of possible behaviors of the circuit, having a means for determining which of those behaviors have been simulated, and which not, and/or the number of times the simulated events occurred. The data from such measurements can be expressed as a ratio (events simulated to events not simulated), a percentage, or simply as a list of covered and/or uncovered events, possibly giving the number of occurrences of the covered, or simulated, events. VLSI design methodologies generally lack both a means of defining possible behaviors of a circuit and a means of determining such coverage, should such a definition be given. As a result, the selection of simulation input patterns is often inefficient. Certain behaviors are tested with unnecessary repetitiveness, with no net gain to the verification effort, while others are never tested at all.

Before outlining the Simulation Coverage Measurement implemented in this invention, some background material must be presented.

A Synchronous Digital Circuit is composed of primary inputs, primary outputs, Combinational Logic Elements (such as AND gates, NOR gates), and/or transistors. Synchronous Circuits also may have "Storage" or "Memory" Elements, usually termed "Flip-Flops" or "Latches", each of which operates synchronously on a Clock Signal that is derived from a global Clock Signal of the circuit. Combinational Logic Elements implement Boolean Logic Functions: AND, OR, NOT, and combinations of these, and do not operate synchronously on any derived, or global Clock Signal. In this text, the term "Combinational Logic Function" and "Boolean Logic Function" can be assumed to have the same meaning. Memory Elements are characterized by the fact that, under certain conditions, they retain a value on their outputs, even if the values on certain of their inputs change. This is never true of Combinational Logic Elements, which always respond to changes on their inputs, after a delay given by the physical characteristics of the element.

Combinational Circuits are distinct from Sequential Circuits in that the outputs of a Combinational Circuit depend only on its current input values, whereas the outputs of a Sequential Circuit depend on some stored information, plus, possibly, the values of current inputs. Hence a Sequential Circuit must contain some elementary Memory Elements. These Memory Elements have digital logic values "0" or "1" on their outputs, at any given point in time. The ordered set of 0, 1 values on the outputs of these Memory Elements is considered to be the "State" of the Sequential Circuit. This is the well established industry definition of the term "State", relative to Synchronous Digital Circuits, and will be so used herein. It should be emphasized that any synchronous, digital circuit having any Memory Elements is a sequential circuit.

The term "Sequential Circuit" will refer to any circuit which, taken as a whole, contains one or more Memory Elements. Such a Sequential Circuit could, and usually does, have Combinational Circuit Elements connected to the sequential ones. The term "Combinational circuit", will refer to circuits which, within their boundary, have only Combinational Logic Elements.

The outputs of Memory Elements only change value if certain Input Signals are being asserted, these signals usually referred to as "Clock" signals. When one or more of these Clock Signals are being asserted, and only at such times, outputs of Memory Elements will change in response to the values on other, non-Clock inputs. Otherwise, the outputs of Memory Elements are not responsive to changes at non-Clock inputs.

As mentioned above, the state of a circuit is defined to be the values of the outputs of the Memory Elements of the circuit. If a circuit has "n" Memory Elements, then the largest possible number of states is 2 to the 'n'-th power. It should be noted that even when "n" is relatively small, say 1000, the number of possible states is a finite but extremely large quantity (greater than 10 to the 300 power). The fact that the number of states of a circuit is exponential in the number of Storage Elements is called the "State Explosion Problem".

Given a set of initial states of a circuit, it may be possible that some state, say $S_i$ of the circuit cannot be reached by any Trace of the circuit starting from any of the circuit's valid initial states. In fact, experience shows that often a large fraction of the states of a circuit are not reachable from any of its valid initial states by a possible input sequence. We call the set of states that can be reached by some Input Vector Sequence from any of the valid initial states the "Reachable State Set" or just the "Reachable Set".

A "Finite State Machine" (FSM) is a system consisting of a finite set of States and a State Transition Relation which specifies, for each State $S_i$, the States to which $S_i$ is allowed to transition in one step. A set of Initial States may be specified, each one of which is an acceptable starting state for the system. It is assumed that every State in the Finite State Machine can transition to at least one state, possibly itself. It is well-known (see below), that any Synchronous, Sequential, Digital Circuit $C_0$ can be represented by a Finite State Machine where a state of $C_0$ is defined to be the logic values, either 0 or 1, on the outputs of its Memory Elements. A state $S_i$ transitions to state $S_j$ under input $I_{ij}$ if when input $I_{ij}$ is presented to the input ports of the circuit while the circuit is in state $S_i$, the circuit will transform to state $S_j$ on the next clock event. To illustrate the above, see C. Pixley in "*A Computational Theory and Implementation of Sequential Hardware Equivalence*", DIMACS Series in Discrete Mathematics and Theoretical Computer Science, Volume 3, 1991, incorporated herein by reference. Thus, a Finite State Machine ("FSM") model can serve as an abstract representation of a Sequential Circuit, capturing its sequential behavior. The set of Initial States of the FSM would correspond to the states of the Sequential Circuit after what is known as a "Reset" operation.

Most circuits of interest in digital, VLSI design are sequential circuits, and, as such can be viewed as implementing Finite State Machines (FSMs). There is an ideal, but, unfortunately, impractical method for calculating simulation coverage on such a finite state machine: (a) counting the visitation of reachable states of the circuit during simulation, and (b) counting the taking of possible transitions among reachable states of the circuit during simulation.

This metric, although ideal, is too expensive, both in terms of computer memory storage and computer processing time, to be of interest. Circuits of interest generally have too large a number of reachable states and too large a number of possible transitions among these states, to allow their full enumeration. As mentioned above, this is the State Explosion Problem. The invention described herein adopts a more practical metric, one derived from this ideal metric but allowing a much smaller number of events to be measured. Our invention provides a means of partitioning the reachable state set of a circuit into subsets of states, which we call "State Bins". A well-chosen set of State Bins can have a much smaller cardinality than the set of reachable circuit states, while still yielding important information when used as a simulation coverage metric.

A broad outline of the procedure followed by the invention described herein is as follows:

(a) A user-supplied description of a Composite Circuit and its valid Initial State settings is parsed, the Composite Circuit consisting of an Environment Circuit and Target Circuit model, the Target Circuit being the focus of the simulation coverage analysis, and the Environment Circuit modeling the behavior of the inputs to that Target Circuit, this modeling usually incorporating Non-Determinism, (b) A user-supplied list of circuit nodes, termed the Partition Set, which most often will be a subset of the Composite Circuit's outputs, is read in, (c) Representations of the Boolean functions implemented at the nodes in the Partition Set are created, (d) A State Transition Relation representation is formed, defining the allowable transitions among Composite Circuit Memory Elements, (e) The Reachable State Set of these Composite Circuit Memory Elements is calculated, (f) The above State Transition Relation representation is transformed into a State Bin Transition Relation, by eliminating state variables representing nodes not in the Partition Set, and replacing these with new state variables representing nodes in the Partition Set, (g) The set of Reachable State Bins is calculated, (h) The above State Bin Transition Relation representation is intersected with representations of the Reachable State Bin set, in order to delete representation of transitions among unreachable State Bins, (i) Traces from one or more simulations of the Target Circuit are compared to the data encoded in the State Bin Transition Relation, and the set of reachable State Bins. The following data is then output (depending on user options):

1. For each reachable "State Bin", the number of times that Bin was visited, with a special listing of State Bins never visited, 2. For each allowable "State Bin" transition, the number of times the transition was taken, with a special listing of transitions never taken, and 3. Percentages/ratios, showing the number of reachable "State Bins" versus the number actually visited during simulation, and the number of allowable "State Bin" transitions, versus the number actually taken during simulation.

It should be noted that there are several optimizations possible in addition to the above, basic steps. For example, in (d) it is not stated which Composite Circuit Memory Elements are selected for representation in the State Transition Relation. It could be all, or only a subset. A useful optimization is to select only the subset of Composite Circuit Memory Elements upon which the nodes in the Partition Set depend, eliminating all others. Care will be taken in this document to separate essential steps from optimizations. The above, and other optimizations, will be discussed when the figures are discussed.

One implementation of this invention is the SBCC program. Not every run of this program must include all the steps in the above outline, or even have the same order of steps. Alternate ways of invoking SBCC will also be explained when the figures are discussed. The extent of data collection and data output in step (i), above, is optional. For example, the user can specify that only State Bin visitations should be monitored, not the (usually more numerous) State Bin transitions. Likewise, an exact count of visitations/transitions can be foregone, in favor of simply checking for at least one occurrence.

It should be noted that the State Transition Relation gives information on possible values of Composite Circuit Memory Elements, while the State Bin Transition Relation gives information on possible values of Composite Circuit nodes in the Partition Set, which may be outputs of Combinational logic elements or Memory Elements. The State Bin Transition Relation may, and in the general case will, contain information on possible ordered sets of values of nodes implementing arbitrary Combinational logic functions, and possible transitions from one such ordered set of values to another—without necessarily containing any information at all on the Composite Circuit Memory Elements on which these functions depend.

For the purpose of Simulation Coverage estimation, the visitation of a State Bin means the visitation of just a single state from that State Bin. Likewise, the taking of a possible transition between two State Bins means the transition from any member of one State Bin to any member of the other. With proper partitioning of the state space into State Bins, the number of events to enumerate can become significantly smaller than the number of individual state visitations and/or individual state transitions. It is this reduction in the number of simulation events to monitor that makes the State Bin method efficient and desirable.

In order to fully explain the methods utilized by the invention, background material on symbolic representation of Boolean functions, circuit states and sets of circuit states, will be presented. In addition, material on non-deterministic finite state machines, and other pertinent subjects, will also be presented.

Regarding the manner in which a digital circuit is presented to the invention, typically in current VLSI design methodology design data is organized hierarchically. The hierarchy can be generally related to abstraction levels. A programming language description of a circuit's behavior is considered higher than a transistor schematic, because it is more abstract. The transistor schematic gives more concrete information as to how an actual circuit will be constructed. The main levels of VLSI design hierarchy which are important to note are (in order higher to lower):

1. Programming language, or Hardware Description Language (HDL) description;
2. Gate level net-list, or schematic; and
3. Transistor level net-list, or schematic.

HDLs differ from other high-level programming languages only in that certain data types are defined which makes it convenient to describe electrical circuit behavior. For example, one data type may be able to take on Boolean True/False values. There may also be special keywords that denote Clock signals and the like. However, digital hardware can often be adequately described in a non-specialized programming language, such as "C". A "Gate Level Net-List" (or schematic) refers to a representation of a circuit as interconnected Memory Elements and "Logic Gates", Logic Gates being symbols, or symbolic names, representing Boolean functions. A "Transistor Level Net-List" (or schematic) outlines the interconnections between transistors. Since all logic gates and all Memory Elements are composed of transistors, this is a much more fundamental, and detailed description.

Descriptions at all three levels of hierarchy can be simulated in a digital simulator. Our invention can also calculate simulation coverage for circuits described in all three formats. All that is needed is the appropriate parser to extract the finite state machine which the circuit represents, and such a parser generally needs only to be able to differentiate Combinational Logic elements from Memory Elements, in order to do that.

Models in any of the three formats described above can be simulated by computer programs such as the many commercial digital Verilog or VHDL simulators available. In order to simulate them, these computer models are initialized to specific states (possibly with unknown or "x" values on certain storage inputs). Then sequences of primary input vectors prescribed by the user of the simulator are introduced to the circuit models. The simulators calculate the new values of the nodes in the circuit based upon the input vectors. At the user's discretion, a record of selected input values and/or selected values of the circuit's internal nodes outputs can be recorded during simulation. These records are called Simulation Traces or just Traces. Our invention can be used to parse such traces, and compare the events simulated to those which our invention determines should be monitored.

The invention described herein relies upon symbolic representation of sets of states and of Boolean functions. Such representations can often describe a FSM much more concisely than explicit descriptions, such as explicit state graphs or explicit state tables. In the past, tools to analyze properties of FSMs depended upon listing all states in the FSM explicitly. In 1989-90 a new approach to Finite State Machine analysis was developed using a data structure called a "Binary Decision Diagram" or "BDD" (see below). With this technology, sets of states were able to be handled without explicit state enumeration. This has allowed much larger FSMs to be analyzed than could be handled with explicit state enumeration techniques. This is described in detail by C. Pixley in "*A Computational Theory and Implementation of Sequential Hardware Equivalence*", DIMACS Series in Discrete Mathematics and Theoretical Computer Science, Volume 3, 1991, C. Pixley, in "*Apparatus and Method for Determining Sequential Hardware Equivalence*", U.S. Pat. No. 5,331,568, issued Jul. 19, 1994, by J. R. Burch, E. M. Clarke, and D. E. Long in "*Representing Circuits More Efficiently in Symbolic Model Checking*", in Proc. 28th ACM IEEE Design Automation Conf., 1991, by J. R. Burch, E. M. Clarke, D. E. Long, K. L. McMillan, and D.L. Dill in "*Symbolic Model Checking for Sequential Circuit Verification*", IEEE Transactions on Computer-Aided Design of Integrated Circuits and Systems, pp. 401–424, Vol. 13, No. 4, April 1994.

We will refer to methods which store and manipulate descriptions of Finite State Machines without explicit state enumeration as "implicit" methods (of Finite State Machine representation). While the preferred embodiment of the invention described herein utilizes BDDs, the invention is easily extendible, by ones skilled in the art, to embodiments that utilize other data structures for implicit Finite State Machine representation.

Binary Decision Diagrams (BDDs) are a type of data structure which is particularly well-suited for describing and manipulating Boolean functions. Randy Bryant, of Carnegie Mellon University presented BDDs and various algorithms for their manipulation, in 1986. Since then BDDs have been widely used in the field of VLSI (Very Large Scale Integration) CAD (Computer Aided Design). A more exact notation would be "ROBDDs", meaning Reduced, Ordered, Binary Decision Diagrams. This term denotes that the form of Decision Diagrams utilized in this invention, as in Bryant's method, have a chosen ordering of function inputs, and have been reduced to canonical form for that ordering. However, for brevity the term "BDDs" will be used hereinafter.

BDDs were introduced by R. Bryant in "*Graph-Based Algorithms for Boolean Function Manipulation*", IEEE Trans. on Computers, Vol. C-35, No. 8, August 1986, incorporated herein by reference. An implementation of BDDs was described by K. S. Brace and R. L. Rudell and R. E. Bryant in "*Efficient Implementation of a BDD Package*", Design Automation Conference 1990, pp. 40–45, June, 1990, incorporated herein by reference. Boolean manipulation of BDDs was described by R. Bryant in "*Symbolic Boolean Manipulation with Ordered Binary-Decision Diagrams*", ACM Computing Surveys, Vol. 24, No. 3, September 1992, incorporated herein by reference. Ways of keeping BDD size down by reordering variables is described by R. Rudell in "*Dynamic Variable Ordering for Ordered Binary Decision Diagrams*", Proceedings of the IEEE International Conference on Computer Aided Design 1993, pp. 42–47, November 1993, incorporated herein by reference.

The usage of BDDs to verify electrical circuits was described by J. R. Burch, E. M. Clarke, and D. E. Long in "*Representing Circuits More Efficiently in Symbolic Model Checking*", in Proc. 28th ACM IEEE Design Automation Conf., 1991, by J. R. Burch, E. M. Clarke, D. E. Long, K. L. McMillan, and D. L. Dill in "*Symbolic Model Checking for Sequential Circuit Verification*", IEEE Transactions on Computer-Aided Design of Integrated Circuits and Systems, pp. 401–424, Vol. 13, No. 4, April 1994, by S. Malik, A. Wang, R. Brayton, and A. Sangiovanni-Vincentelli in "*Logic Verification Using Binary Decision Diagrams in a Logic Synthesis Environment*", Proceedings of the IEEE International Conference on Computer Aided Design, pp. 6–9, 1988, by H. Cho, G. D. Hachtel, S. W. Jeong, B. Plessier, E. Schwarz, and F. Somenzi. in "*ATPG Aspects Of FSM Verification*", Proceedings of the IEEE International Conference on Computer Aided Design, pp. 134, 137, November 1990, and by C. Pixley in "*A Computational Theory and Implementation of Sequential Hardware Equivalence*", DIMACS Series in Discrete Mathematics and Theoretical Computer Science, Volume 3, 1991, all incorporated herein by reference.

BDDs are useful for three distinct reasons:
1. They can often provide a concise representation, in terms of computer storage, for a Boolean function.

BDDs are quite often many orders of magnitude smaller than other representations, such as truth tables, sum-of-products, etc.

2. They always provide a canonical representation of a given Boolean function, for a fixed ordering of its inputs.

3. Algorithms for manipulating BDDs provide an easy and understandable means of operating on existing Boolean functions with logic operators, composing such functions (i.e., building the representation of one Boolean function which takes one or more Boolean functions as its arguments), and so forth.

Building a monolithic and/or partitioned FSM State Transition Relation representation is carefully described by J. R. Burch, E. M. Clarke, D. E. Long, K. L. McMillan, and D. L. Dill, in "*Symbolic Model Checking for Sequential Circuit Verification*", IEEE Transactions on Computer-Aided Design of Integrated Circuits and Systems, pp. 401–424, Vol. 13, No. 4, April 1994, incorporated herein by reference. Likewise, computing a representation of the reachable state set, from a given set of states is also described therein.

In this document, reference will be made to "existentially quantifying away" an arbitrary variable out of a BDD representation of a Boolean function. This is explained in the article by E. Clarke, O. Grumberg, K., McMillan, X. Zhao, entitled "*Efficient Generation of Counter examples and Witnesses in Symbolic Model Checking*", Semiconductor Research Corporation, Publication Number C94564, November 1994. If 'v' is one of the 'n' arguments to the Boolean function, 'f', 'n' being a positive integer, then the result of existentially quantifying away 'v' is a BDD representing the disjunction of 'f' with v=1, and 'f', with v=0. This disjunction is a new Boolean function of n−1 arguments, i.e., all the arguments of 'f', except for 'v'.

Despite the fact that BDDs offer a very concise representation for many classes of Boolean functions, the massive mount of information needed to characterize sequential circuits results in practical limitations on the size of circuits that our invention can handle. In general, a "Target" Circuit of the appropriate size is identified, for which we want to measure simulation coverage, and this Target Circuit would usually be a circuit "Block" inside of a larger circuit.

In order to properly represent the state transition behavior of this Target Circuit, its environment must be characterized. For example, if the real operating environment of the Target Circuit is constrained so that some combinations of values or sequences of such combinations, cannot occur, then this generally alters the set of Reachable States of the Target Circuit (in comparison to the case where no such constraints exist). These constraints on the input behavior must be modeled, in order to accurately compute the set of Reachable States. It is expected that the user of this invention will create an "Environment Circuit" model. All inputs to the Target Circuit are modeled as emanating from this Environment Circuit, which may be constructed hierarchically, composed of sub-circuits, sub-sub-circuits, etc.

One by-product of making an Environment Circuit that it allows one to abstract, in a concise way, the input behavior for the Target Circuit. These abstractions are generally have much smaller computer storage requirements than the actual circuit representations. An Environment Circuit can often be modeled as a Non-Deterministic Finite State Machine (FSM). A Non-Deterministic Finite State Machine is one in which the present state and input does not always determine the next state uniquely. For example, given a certain state of an Environment Finite State Machine, say $S_j$, and a certain input, i, one may wish to specify that the next state of the Environment can be either $S_k$ or $S_l$, non-deterministically. It is common for Non-Deterministic FSMs to have much more concise descriptions than for Deterministic FSMs. Intuitively, this type of modeling is possible because the behavior of the Target Circuit is only dependent on the external signals emanating from neighboring blocks, and not on the internal state of those blocks. The resulting Transition Relation of this abstracted neighboring block is much simpler than that of the real neighboring block—which means that the data structures for storing the transition relation can often be much smaller.

Note that in the disclosed embodiment, the Target Circuit is not modeled Non-Deterministically. Instead, an exact model of the Target Circuit is used, exact in the sense that the model is as close to a true description of the circuit which will be built, as the level of design hierarchy demands. As noted above, the invention can be extended to circuits modeled by Non-Deterministic FSMs.

All circuits referred to herein are Digital Circuits. However, the invention is also applicable for circuits that may have one or more analog elements, but which take digital input, and give digital output. An example would be a RAM circuit, which might have internal sense amplifiers operating on analog principles, but which has digital input and output signals.

In general, the Target Circuit will usually be at modeled what is called the Block level. This refers to the fact that large circuit designs, microprocessors for instance, are usually broken down hierarchically. At the top of the hierarchy is the full chip, for example a complete microprocessor. Below that, smaller "Functional Units" (e.g. a Floating Point Unit (FPU)) are defined. Functional Units are further broken down into smaller components, called "Blocks". The preferred embodiment focuses primarily at this "Block" level due to current size constraints related to the BDD techniques utilized.

The invention disclosed herein is obviously applicable and usable at both higher and lower hierarchical or abstraction levels.

FIG. 1 is a block diagram showing the hardware components of the invention. There is a computer 10 which has a Computer Processor 12 and Memory 14 connected by a Bus 16. Also connected to the Bus 16 is Secondary Storage 20, monitor 22, keyboard 24, laser printer 26, and External Storage 28. Primary Memory 14 is customarily RAM, but may also comprise ROM, SRAM, Bubble Memory, and any such medium with equivalent functionality. Secondary Memory 20 is lower speed but has higher capacity than Primary Memory 14. It commonly is a hard disk drive, but may also comprise bubble memory, flash memory, drum storage, or even lower speed RAM. External Storage 28 includes floppy disks, CD-ROM drives, magnetic tape, another computer, and any functionally equivalent medium.

Computer programs 29, such as SBCC 30 (see FIG. 2), customarily are initially installed from External Storage 28 onto Secondary Storage 20. The programs 29 are then loaded into primary Memory 14 from whence they execute on Computer Processor 12. The input and output files shown in FIG. 2 are located on Secondary Storage 20.

Figure 2:
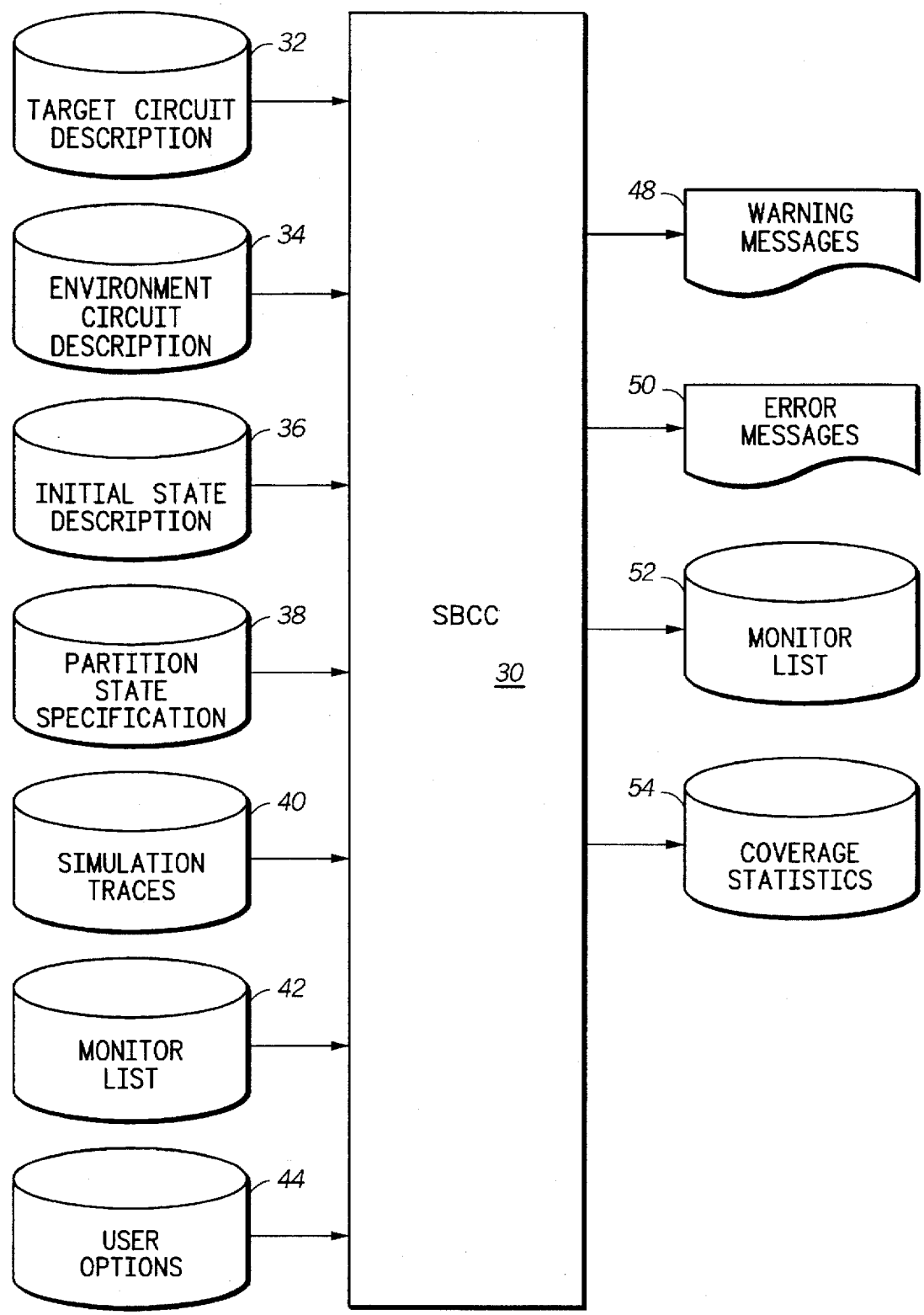
FIG. 2 is an Input/Output chart showing, in accordance with the present invention, the SBCC program with its inputs and outputs.

FIG. 2 is an input/output block diagram showing the State Bin Coverage Checker ("SBCC") program 30 with its primary inputs and outputs. The SBCC program 30 has seven primary inputs, shown as disk files in FIG. 2. The first input is a Target Circuit description 32. The second input is the Environment Circuit description 34. Both of these circuit descriptions may be in a standard format, such as one of the HDLs described above. The third input is an Initial State description 36. One option is to specific it through use of a HDL. The fourth input is a Partition Set Specification 38. This is a list of Target Circuit nodes upon which to base the partitioning of the Composite Circuit's state space into State Bins. The fifth input, 40, is a set of Traces from simulations. SBCC will compare such traces to the simulation events (State Bin visitations, and/or State Bin transitions) which it determines should be monitored. The sixth input, 42, is a monitor list. This is a list of simulation events to monitor, State Bin visitations and/or State Bin transitions, produced by a previous run of the SBCC program. In one mode of operation, the SBCC program is able to compare such a monitor list 42 to simulation traces 40, and produce simulation coverage statistics 54. The seventh input, 44, is a set of user options. Since some of these options deal with outputs of the SBCC program, their discussion will be deferred until SBCC outputs are discussed. The files for primary inputs are located on a Secondary Storage 20 (shown in FIG. 1).

The SBCC program 30 has four primary output classes. The first class of outputs are warning messages 48. The second class of outputs are error messages 50. An example of a warning message is a message stating that a certain memory usage level has been exceeded, but that the program is continuing on. An example of an error message is notification that a node name listed in the Partition Set cannot be found in the Target Circuit. The third class of outputs are the lists of State Bins and State Bin transitions to be monitored, during simulation, 52. The fourth class of outputs are such lists with coverage measurement statistics added, 54. It is a user option (explained below) to output a list of State Bins and State Bin transitions to monitor 52, without comparing these to simulation traces 40. When simulation traces 40 are inspected and compared to State Bin visitations and State Bin transitions which SBCC has determined are possible for the Composite Circuit, then coverage measurements are made, and such statistics added to the list of State Bins and State Bin transitions, giving the output class 54. The four output classes will usually be staged to Secondary Storage 20 (shown in FIG. 1) before being printed on a printer 26 (shown in FIG. 1).

Figure 4:
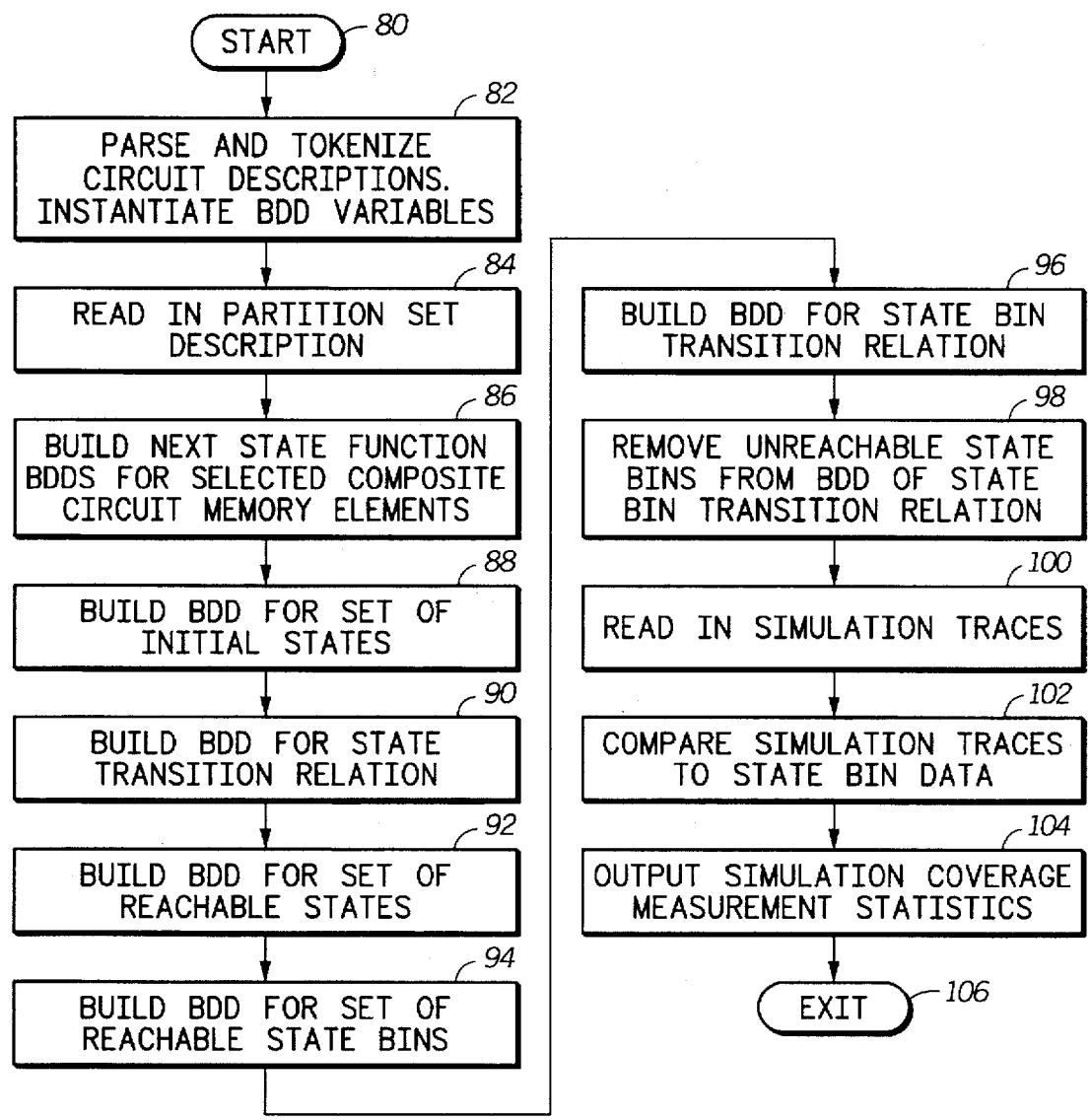
FIG. 4 is a flow chart showing the high level operation of the SBCC program, in accordance with the present invention.
Figure 6:
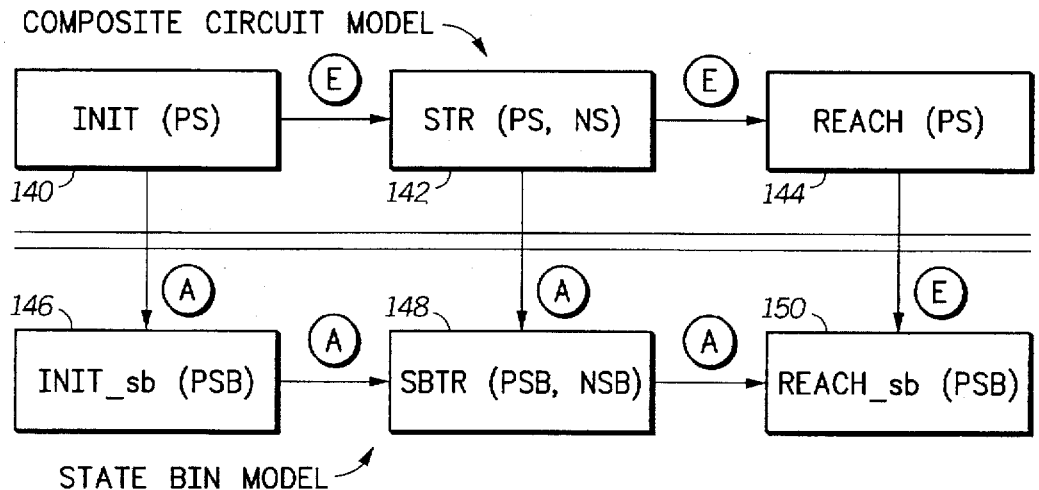
FIG. 6 is a pictorial representation showing the different high level steps for finding an exact representation of Reachable State Bins versus an approximate representation the Reachable State Bins.

The user options 44 will now be discussed. A partial list of these options 44 is:

(a) To make an approximate, rather than exact, calculation of Reachable State Bins and allowable State Bin transitions. The approximate calculation usually entails less memory usage and CPU time than the exact calculation. FIG. 6 explains the steps involved in the approximate calculation, while FIG. 4 illustrates the exact calculation. The default behavior is to do an exact calculation of Reachable State Bins and allowable State Bin transitions.

(b) To represent all Composite Circuit Memory Elements in the various data structures built by the SBCC program 30, e.g., the BDDs of sets of Initial States, Reachable states, the State Transition Relation, etc. The default behavior is to represent only those Composite Circuit Memory Elements upon which nodes in the Partition Set 38 have a dependence (see FIG. 7, where the procedure for finding these Composite Circuit Memory Elements is illustrated). See the discussion of Step 86 in FIG. 4.

(c) To not monitor State Bin transitions, which are usually much more numerous than State Bin visitations. The default behavior is to monitor both State Bin visitations and transitions.

(d) To output only a list of simulation events to monitor 52—i.e., State Bin visitations and/or transitions, In this mode, the program will not try to read in simulation traces 40 nor will it output coverage statistics with the list of simulation events 54. The default mode is to list simulation events to monitor, and parse simulation traces 40 in order to output a combined list of simulation events to monitor and coverage measurements 54.

(e) To output coverage measurements 54 based on a list of simulation events to monitor 42 which was produced by a previous run of the program. In this case, inputs 40 and 42 (simulation traces and a monitor list) are used to output coverage measurements 54, but the various circuit descriptions 32, 34, 36, 38 are not needed.

(f) To simply record the occurrence or absence of a specified monitored event (i.e., State Bin visitation or transition) in the simulation coverage measurements 54, rather than its exact number of occurrences. The default mode is to output a count of all occurrences.

(g) To check if simulation traces 40 record a visitation to a State Bin that is not among the set of Reachable State Bins and to output an error message should this occur. (Such an occurrence would indicate inaccurate information being input by the user, because the appearance of such a State Bin in the simulation traces 40 shows that it must be reachable in the real circuit model. Either the Environment Circuit 34 is an inaccurate model, as compared to the real environment in which the Target Circuit exists, or the Initial State information 36 is inaccurate. Either could result in inaccurate calculation of the sets of Reachable State Bins and allowable State Bin Transitions. It should be noted that the approximate method of calculating reachable State Bins and allowable State Bin Transitions, discussed above and illustrated in FIG. 6, cannot cause such errors. This approximate calculation always results in an over-estimation of the set of Reachable State Bins. i.e., a State Bin that is reachable is never left out of the approximated set. It is an approximation only in the respect that State Bins which are not, in fact, reachable, can get included in the reachable State Bin set. So, the approximate reachability analysis discussed relative to FIG. 6 could never result in omission of a reachable State Bin. Only incorrect Initial State or Environment Circuit modeling could do that.) The default is to not do such checking, since it incurs a significant computational cost.

Figure 3:
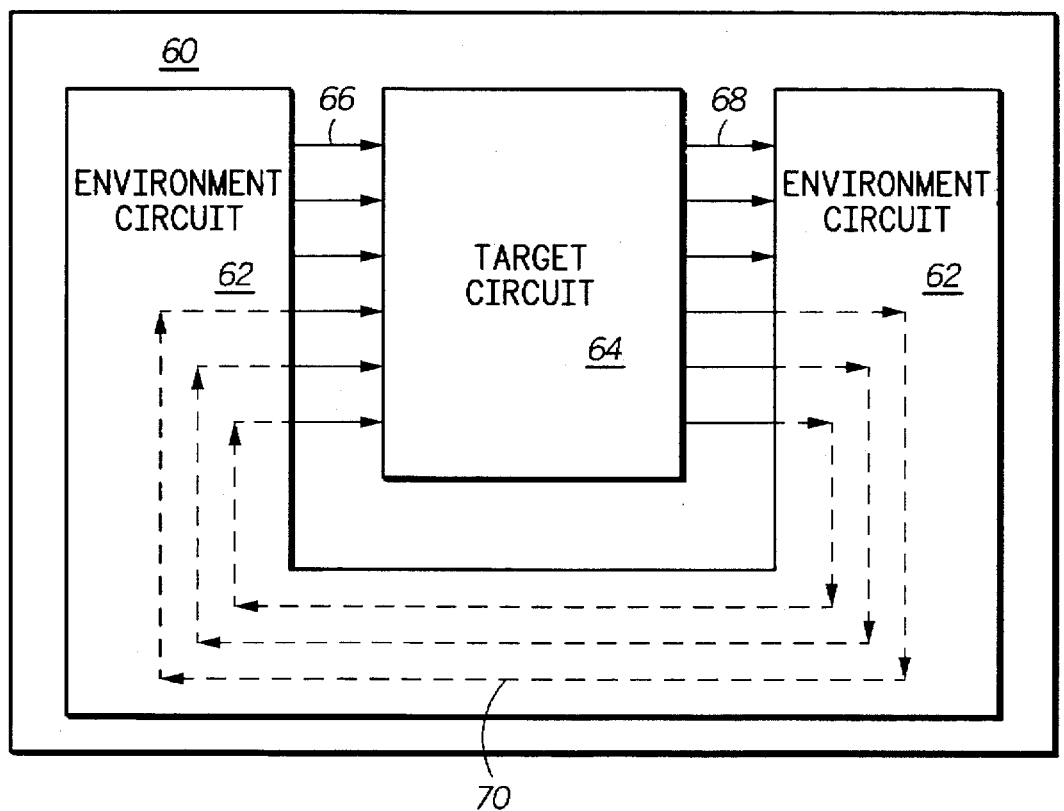
FIG. 3 is a block diagram showing the system model used by the SBCC system, in accordance with the present invention.

FIG. 3 is a block diagram showing the system that is modeled by the SBCC program 30.

The Composite Circuit 60 includes an Environment Circuit 62, and the Target Circuit 64. The outputs from the Environment Circuit 66 are the inputs to the Target Circuit 64 and the outputs of the Target Circuit 68 may be inputs to the Environment Circuit 62. Note the dotted lines showing possible feedback 70 from the Target Circuit output 68 to the Environment Circuit output 66. The model of the Environment Circuit 62 may be Non-Deterministic.

FIG. 4 is a flow chart showing the high level operation of the SBCC program 30. FIG. 4 shows how the SBCC program 30 makes an exact calculation (on the basis of the user's Environment model and Initial State specifications) of the set of Reachable State Bins and allowable State Bin transitions. An approximate calculation is also possible, and may prove of benefit in some situations. FIG. 6 details how to make an approximate calculation of Reachable State Bins and allowable State Bin transitions.

The program is entered, 80. The needed descriptions are parsed and tokenized, step 82, which includes the Target Circuit description 32, Environment Circuit description 34, and Initial State description 36. BDDs are instantiated for all Composite Circuit Memory Elements and primary inputs, during step 82.

Figure 7:
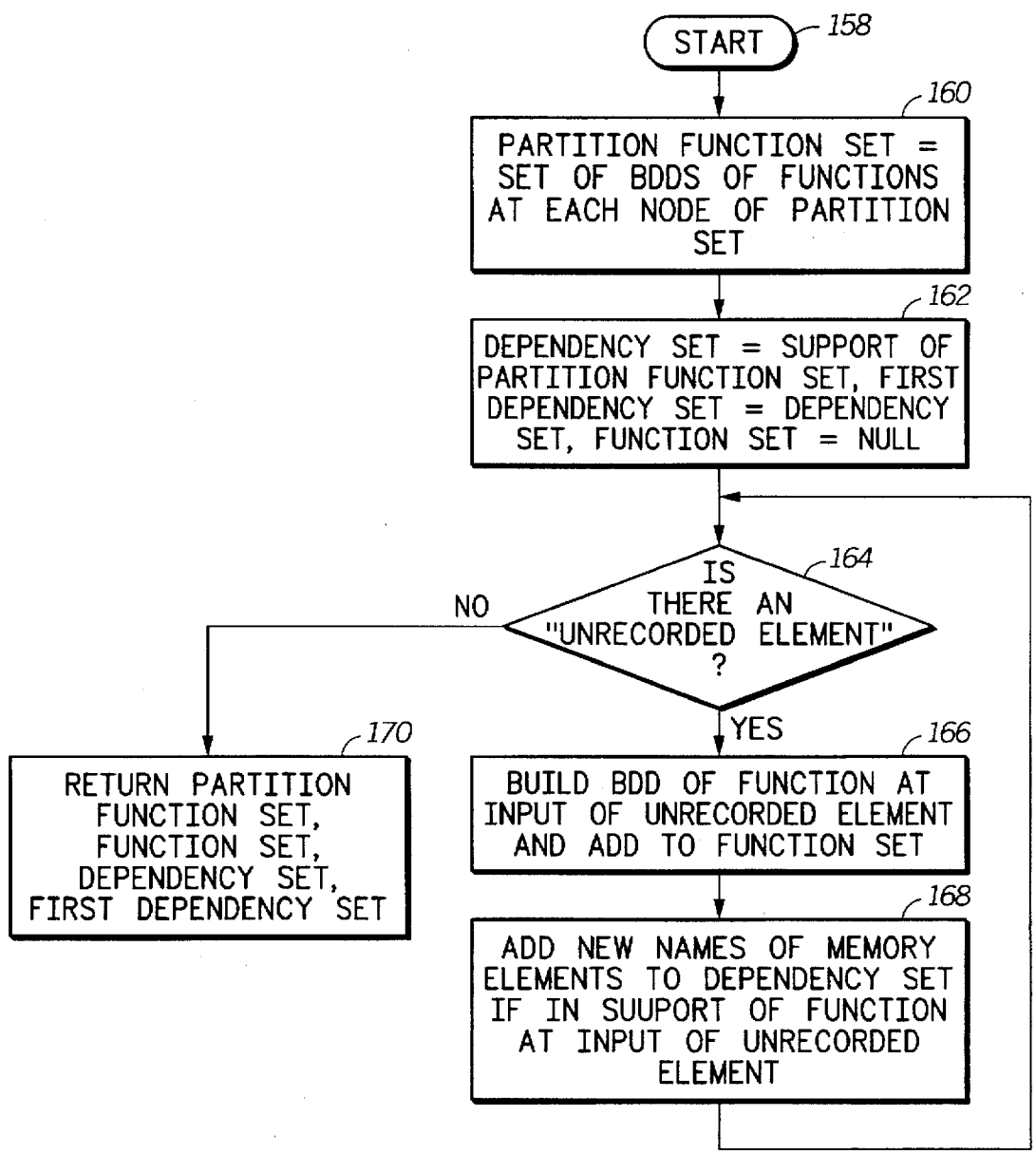
FIG. 7 is a flow chart showing the procedure for finding the full set of Composite Circuit Memory Elements upon which a particular set of Composite Circuit nodes have a dependence, in accordance with the present invention.

Next the list of Composite Circuit nodes comprising the Partition Set 38 is read in, step 84. A set of Composite Circuit Memory Elements is selected, and Next State Function representations are built for each member of this set, step 86. The set of Memory Elements selected may be all the Memory Elements in the Composite Circuit, or, if the user options dictate, only those Memory Elements upon which the nodes in the Partition Set 38 have a dependence. This latter is an optimization, in the sense that the program will produce correct results if not done. But, since it is, generally, the more efficient method, it is also the default method of the SBCC program (see discussion of user options 44). The recursive procedure for finding the set of Composite Circuit Memory Elements upon which the set of nodes in the Partition Set depends is illustrated in FIG. 7.

A Next State Function such as those built in step 86 is defined as follows. A Next State Function for an arbitrary Memory Element is a function which takes as its arguments a variable representing the next state of the Memory Element, and a representation of the Boolean function implemented at the input of the Memory Element. A Memory Element's output transitions to some new value upon a defined clock event, and that new value is determined by the function implemented at the Memory Element's input. This is the intuitive sense of the Next State function. The Next State function of any arbitrary Memory Element, M, may be considered to be an XNOR of two Boolean functions: a Boolean function returning the value of the variable representing the next state of M, and the Boolean function implemented at the input of M. The Next State function returns TRUE if and only if, given an assignment of values to the variables of the Boolean function implemented at its input, a transition to the value assigned to the next state variable is allowable. The Boolean function implemented at the Memory Element's inputs is a function over one or more variables representing primary circuit inputs and/or present state values on the outputs of the same Composite Circuit Memory Element which the Next State function represents and/or other Composite Circuit Memory Elements. The case where the Next State Function of a Composite Circuit Memory Element has a dependence on a variable representing the present state of that same Memory Element is the case where direct (i.e., only through Combinational elements) feedback exists, from the output of the Memory Element to its input.

In step 88, a BDD representation of the set of legal Initial States is built. This is a BDD representation of the valid initial settings for all the Composite Circuit Memory Elements selected in step 86, and is constructed from the information supplied in the Initial State description, 36. The Initial State description 36 is given in a format such that the initial setting for any individual Composite Circuit Memory Element can be captured by a Predicate over Composite Circuit Memory Elements. We will call these Predicates "Initial Value Predicates". Consider, for example, two Composite Circuit Memory Elements, A and B. Assume A and B have a dependence such that their initial values are constrained to be the same, i.e., they can both initially be 0 or 1, but they cannot be different from each other. Then the Initial Value Predicate for A, which we will call Init_A, is:

Init_A(A,B)=(A^B)|(!A^!B);

where ^ stands for conjunction, | for disjunction, and ! for negation. The Initial Value Predicate for B, Init_B, would be exactly the same function. Another very common example of an Initial Value Predicate, for some Memory Element, X, is:

Init_X(X)=!X;

Init_X returns TRUE if and only if the initial value of Memory Element X is 0. The case where the initial value of a Memory Element, say Y, is totally unconstrained is captured by the Predicate:

Init_Y(Y)=TRUE;

The BDD representation of legal Initial States of various Composite Circuit Memory Elements, built in step 88, is constructed by first forming BDD representations of the Initial Value Predicates of each Composite Circuit Memory Element selected in step 86, and then forming the BDD representation of the conjunction of all these Initial Value Predicates. The conjunction of all such Initial Value Predicates is the characteristic function of the set of legal Initial States for the Composite Circuit Memory Elements in question.

A State Transition Relation BDD is then built, step 90, from the set of Next State Function BDDs calculated in step 86. This representation may be monolithic (i.e., the State Transition Relation for all Memory Elements of interest is represented in one single data structure), or it may be partitioned (i.e., separate representations exist, each representing state transitions among subsets of the set of Memory Elements of interest). Use of a partitioned transition relation is an optimization that can result in more economical memory usage, albeit at the expense of more intensive computation time. All of our basic methods, such as our Generalized Predicate Mapping method explained in FIG. 5, will work with either partitioned or monolithic State Transition Relation representations. The procedure for building a State Transition Relation representation from a set of Next State function representations is described in detail by C. Pixley in "*A Computational Theory and Implementation of Sequential Hardware Equivalence*", DIMACS Series in Discrete Mathematics and Theoretical Computer Science, Volume 3, 1991, and by J. R. Burch, E. M. Clarke, D. E. Long, K. L. McMillan, and D. L. Dill in "*Symbolic Model Checking for Sequential Circuit Verification*", IEEE Transactions on Computer-Aided Design of Integrated Circuits and Systems. pp. 401–424, Vol. 13, No. 4, April 1994, both articles incorporated hereinbefore by reference, the latter article also detailing the construction of partitioned transition relations. Dynamic reordering of BDDs may be triggered at any time during step 90 (and at any other step involving BDD building), to reduce the number of BDD nodes. Dynamic variable reordering has been described by R. Rudell in "*Dynamic Variable Ordering for Ordered Binary Decision Diagrams*", Proceedings of the IEEE International Conference on Computer Aided Design 1993, pp. 42–47, November 1991, incorporated hereinbefore by reference.

In step 92, the set of Reachable States of the Memory Elements selected in step 86 is calculated, by manipulation of the BDDs for the set of Initial States 88 and the State Transition Relation 90. This reachability analysis is performed by manipulating these BDDs in a manner described by C. Pixley in "*A Computational Theory and Implementation of Sequential Hardware Equivalence*", DIMACS Series in Discrete Mathematics and Theoretical Computer Science, Volume 3, 1991, and by J. R. Burch, E. M. Clarke, D. E. Long, K. L. McMillan, and D. L. Dill in "*Symbolic Model Checking for Sequential Circuit Verification*", IEEE Transactions on Computer-Aided Design of Integrated Circuits and Systems. pp. 401–424, Vol. 13, No. 4, April 1994, and by H. Cho, G. D. Hachtel, S. W. Jeong, B. Plessier, E. Schwarz, and F. Somenzi in "*ATPG Aspects Of FSM Verification*", Proceedings of the IEEE International Conference on Computer Aided Design, pp. 134, 137, November 1990, all articles incorporated hereinbefore by reference.

Image and pre-image calculation, the operations which respectively rerun the set of states which can be reached in exactly one time step from some given set of states, and the set of states from which a given set of states can be reached in one time step, is an integral part of reachability analysis, and is carefully described in E. M. Clarke, D. E. Long, K. L. McMillan, and D. L. Dill, in "*Symbolic Model Checking for Sequential Circuit Verification*", IEEE Transactions on Computer-Aided Design of Integrated Circuits and Systems. pp. 401–424, Vol. 13, No. 4, April 1994, incorporated herein by reference. The result of step 92 is a BDD which represents the entire set of Reachable States of the Composite Circuit Memory Elements of interest (i.e., those selected in step 86).

Figure 5:
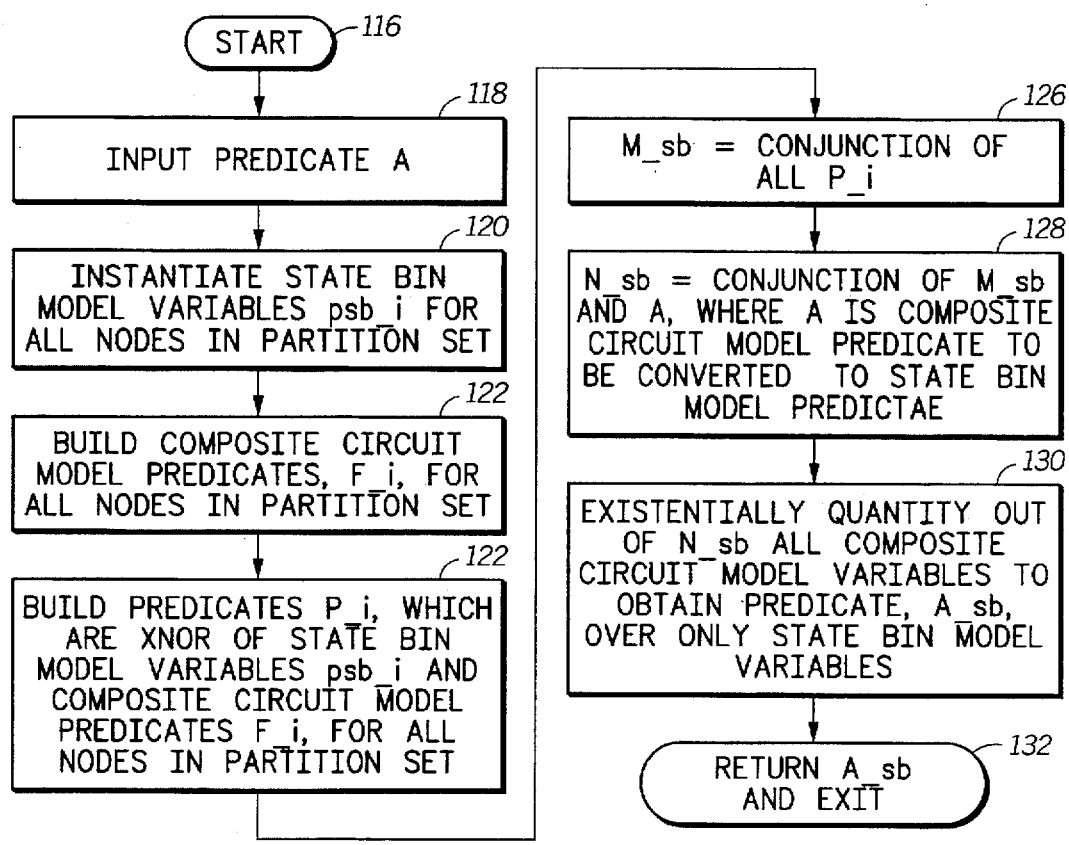
FIG. 5 is a flow chart showing the Generalized Predicate Mapping procedure from FIG. 4 by which predicates over variables representing Composite Circuit Memory Elements are converted to predicates over variables representing State Bins.

In step 94, the set of Reachable State Bins is calculated, by applying the Generalized Predicate Mapping procedure explained in FIG. 5 to the BDD of the Reachable State Set 92. This results in a BDD representing all reachable State Bins, i.e., all realizable permutations of values on the set of nodes in the Partition Set 38.

A State Bin Transition Relation BDD is then built, step 96. The State Bin Transition Relation gives the information, directly, as to which transitions of ordered sets of 0 or 1 values are allowed to appear on all the nodes in the Partition Set 38 upon clock events in the Composite Circuit. The State Bin Transition Relation is built by mapping the BDD representation of the State Transition Relation representation 90 into the BDD representation of State Bin Transition Relation 96, via the Generalized Predicate Mapping method described in FIG. 5.

Since the State Bin Transition Relation representation 96 is built by mapping the State Transition Relation representation 90, and since the State Transition Relation representation 90 contains information on transitions among both reachable and non-reachable states, the State Bin Transition Relation representation built in step 96 will, likewise, contain information about transitions among reachable and non-reachable State Bins. In step 98, the State Bin Transition Relation BDD 96 is transformed into a State Bin Transition Relation BDD containing information solely on transitions among reachable State Bins. This is accomplished by intersecting the State Bin Transition Relation BDD 96 with two copies of the Reachable State Bin BDD 98, one of these copies of the Reachable State Bin BDD having its variables renamed to 'present value' variables, and the other copy having its variables renamed to 'next value' variables. This renaming of variables is necessary because the State Bin Transition Relation 96 has its variables so named, i.e., it has a set of 'present value' variables and a set of 'next value' variables. In the State Bin Transition Relation 96 there will be, for every node in the Partition Set 38 upon which the State Bin Transition Relation has a dependence, one 'present value' variable and one 'next value' variable. The intersection operation of step 98 results in a BDD representation of all allowable State Bin Transitions among Reachable State Bins in the Composite Circuit. Set intersection corresponds to ANDing of BDD representations.

In step 100, a set of user-supplied simulation traces 40 is read in and parsed. A comparison is made, step 102, of these simulation traces 40 to the visitations of Reachable State Bins and the taking of allowable State Bin transitions which SBCC has determined are possible to execute for the Composite Circuit. The knowledge of which State Bin visitations and which State Bin transitions are possible for the Composite Circuit is obtained by traversals of the BDDs for the set of Reachable State Bins 94 and the State Bin Transition Relation 98. Any BDD representation of a set is a representation of the Characteristic Function of that set. The Characteristic Function of a set is a Boolean function which evaluates to TRUE if and only if its argument is a member of the set in question. Thus, any assignments of values to the variables in the BDD representation of the characteristic function of the Reachable State Bins 94, said assignment corresponding to a path from the root of that BDD to a leaf node labeled TRUE, is a Reachable State Bin. The program will traverse the Reachable State Bin Set BDD 94, and find all such assignments, i.e., all reachable State Bins. It will do likewise for the State Bin Transition Relation BDD 98. This BDD has a set of 'present value' variables and a set of 'next value' variables. Both sets represent values on nodes in the Partition 38. The State Bin Transition Relation returns TRUE if and only if, given some assignment of values to the 'present value' and 'next value' variables a transition on the Composite Circuit nodes represented by those variables is possible in one time step of the Composite Circuit, such that the values assigned to the 'present value' variables hold beforehand and the values assigned to the 'next value' variables hold afterwards. Traversal of the State Bin Transition Relation BDD 98 results in outputting all such assignments to 'present value' and 'next value' variables such that these are allowable transitions in the Composite Circuit.

The comparison in step 102 is made with data in a binary format, making optimum use of built-in integer operations in the instruction sets of computers. For example, 1's and 0's representing a Reachable State Bin are packed in integers, and integer operations such as ANDing with integer masks, etc., are used to evaluate if simulation trace data, likewise packed into integers, shows evidence of certain events (State Bin visitations and/or State Bin transitions) having occurred. A State Bin visitation is listed as a string of binary digits, each digit representing a value on a prescribed node in the Partition Set. The order of naming of Partition Set nodes is output as well, allowing the user to match a binary digit in a certain column with a node name. A listing of a State Bin transition is a listing of two such binary strings, the first being the State Bin from which the transition takes place, and the second being the State Bin to which the transition goes. In step 104, results of the comparison operations of step 102 are output. The program is then exited in step 106.

FIG. 4 assumes the SBCC program 30 is run with the default option for output, which is to output a listing of all possible State Bin visitations and all allowable State Bin transitions, plus a count of the number of times each visitation and/or transition occurred. Many other output combinations are possible, and reference should be made to the discussion of step 44, above, as to these.

It should be noted that there are modes of operation of the SBCC program 30 not detailed in FIG. 4. FIG. 4 is meant to detail the most common use of the SBCC program 30, the one in which default behaviors (see discussion of Step 44, FIG. 2) are selected. One alternative mode of operation is that in which an approximate, and not an exact calculation of Reachable State Bins is made. This mode is explained in FIG. 6. Also, there is a mode in which a list of simulation events to monitor 50, produced by a previous run of the program, is input as the monitor list 42 along with some simulation traces 40, and the user options 44 direct the program to compare the simulation traces 40 to the events being monitored 42, and output coverage measurements 54. This mode of operation was deemed simple enough to not warrant a flow chart. Likewise, other choices for various output options 44, for instance, to not calculate and not output allowable State Bin Transitions, were deemed simple enough to not warrant separate flow-charting.

FIG. 5 is an illustration of what we term the "Generalized Predicate Mapping" procedure. The problem solved by this procedure is the following: in general, the SBCC program 30 must build data structures representing Boolean functions over sets of variables representing both Combinational logic outputs and Memory Element outputs. This is because the Partition Set 38, which defines the State Bins, can contain Composite Circuit nodes which are outputs of Combinational Elements or Memory Elements. An example is the BDD for the set of Reachable State Bins 94. The following is the solution adopted by the SBCC program to the problem of combining these two types of variables, those representing Combinational Elements and those representing Memory Elements, in one Boolean function representation:

In the following, we will speak of a "State Bin model" and a "Composite Circuit model". These terms will be explained more fully below, but, briefly, the State Bin model will involve variables representing both Combinational Elements and Memory Elements and the Composite Circuit model will involve variables representing only Memory Elements. To simplify the explanation, we assume that primary Composite Circuit inputs need not be represented; and, in practice, it is often not necessary to represent these.

In general, in SBCC, it is necessary to construct Predicates in the State Bin model from Predicates in the Composite Circuit model. A Predicate involves a finite set of variables, say $x\_1, x\_2, \ldots, x\_n$ which are called the support of the Predicate. A Predicate is by definition a Boolean valued function from the set of all combinations of Boolean assignments to the variables in the support, to the set {TRUE, FALSE}. For example, if the support of some Predicate, P, is $x\_1, x\_2$, then there are four possible assignments to these variables, $x\_1=0$ and $x\_2=0$; $x\_1=0$ and $x\_2=1$; $x\_1=1$ and $x\_2=0$; $x\_1=1$ and $x\_2=1$. P, then, maps each of these assignments to either TRUE or FALSE. For n variables, there are in general 2 to the n possible assignments. A Predicate, for example "$x\_1$ AND $x\_2$", is a function that maps each assignment to either TRUE or FALSE. In the case of the Predicate "$x\_1$ AND $x\_2$", the Predicate maps the assignment "$x\_1=1$ and $x\_=1$" to the value TRUE and all other assignments to the value FALSE. BDDs can represent such Predicates.

Given a Predicate $A(ps\_1, ps\_2, \ldots ps\_u)$ over Composite Circuit Memory Elements, the following is a simple method for computing a corresponding Predicate $A\_sb$ $(psb\_1, psb\_2, \ldots, psb\_k)$ over Partition Set nodes. We will call such Predicates as $A\_sb$, over Partition Set nodes, Predicates of the State Bin model, and we will call such Predicates as A, over Composite Circuit Memory Elements, Predicates of the Composite Circuit model. The nodes in the Partition set define the State Bins, in that there are as many reachable State Bins as there are realizable permutations of 0,1 (i.e., FALSE, TRUE) values on the nodes of the Partition Set. This motivates our use of the term "State Bin model" in connection with Predicates over Partition Set nodes. FIG. 5 illustrates this Generalized Predicate Mapping, i.e., the manner in which Predicates of the Composite Circuit model are mapped to Predicates of the State Bin model.

The routine is entered in step 116, the Composite Circuit model Predicate, A, being input in step 118. In step 120, for each node in the Partition Set 38 a new variable is instantiated. We will term an arbitrary variable of this type, $psb\_i$, denoting the variable representing the i-th element of the Partition Set 38. These are variables in the State Bin model. In step 122, for each node in the Partition Set 38, a Predicate is defined relating that node to Composite Circuit model variables, i.e., to Composite Circuit Memory Elements. For example, consider the i-th node in the Partition Set, designating it as $n\_i$. The value of $n\_i$ is given by a Predicate $F\_i$ over variables representing some number of Composite Circuit Memory Elements, say $ps\_1, ps\_2, \ldots, ps\_m$. Each such Predicate, $F\_i$, will be over a possibly different number of Composite Circuit Memory Elements (i.e., if $F\_i$ is a Predicate over 'm' Memory Elements, $F\_j$, representing the j-th node of the Partition Set, may be a Predicate over 'h' Memory Elements, with 'h' and 'm' not equal, and with all or some of the 'm' Memory Elements in the support of $F\_i$ being different from the 'h' Memory Elements in the support of $F\_j$). In step 124, we form Predicates, $P\_i$, one for each node in the Partition Set 38. These Predicates relate the variables instantiated in step 120 with the Predicates defined in step 122.

For each $psb\_i$ defined in step 120, and each Predicate $F\_i$ defined in step 122, we define a new Predicate, $P\_i$, which is "$psb\_i$ XNOR $F\_i(ps\_1, ps\_2, \ldots, ps\_m)$".

If there are k elements in the Partition Set 38, the combined support of Predicates $P\_1, P\_2, \ldots, P\_i, \ldots, P\_k$ is over some number of variables, say 'q', where q>0, representing unique Composite Circuit Memory Elements, plus 'k' variables representing the nodes in the Partition Set 38, In step 126, assuming 'k' elements in the Partition Set 38, we take the conjunction of $P\_1, P\_2, \ldots, P\_i, \ldots, P\_k$ to obtain a Predicate, $M\_sb$. In step 128, we then form the conjunction of $A(ps\_1, ps\_2, \ldots ps\_u)$ and $M\_sb$ to obtain another Predicate, $N\_sb$. It should be noted that there is nothing in our formulation so far which dictates that the 'u' Composite Circuit model variables over which A is defined must be a subset of the Composite Circuit model variables in the support of $M\_sb$. In most cases, these 'u' variables will, in fact, be such a subset. But, to be more general, let us assume they are not, and that the Predicate $N\_sb$ now is a Predicate over 'r' variables of the Composite Circuit model and 'k' variables of the State Bin model. In step 130, we then existentially quantify $N\_sb$ by the variables $ps\_1, ps\_2, \ldots ps\_r$, to get the Predicate $A\_sb(psb\_1, psb\_2, \ldots psb\_i, \ldots psb\_k)$, and then exit, step 132, returning the Predicate $A\_sb$.

This whole process for calculating Predicate $A\_sb$ from Predicate A is represented by the following formula:

(Exist $ps\_1$)(Exist $ps\_2$) ... (Exist $ps\_r$)($A(ps\_1, ps\_2, \ldots ps\_u)$ & $M\_sb$)

which is the same as (Exist $ps\_1$)(Exist $ps\_2$) ... (Exist $ps\_r$)($A(ps\_1, ps\_2, \ldots ps\_u)$ & $P\_1$ & $P_{13}$ 2 & ... & $P\_k$)

where each $P\_i$ is ($psb\_i$ XNOR $F\_i(ps\_1, ps\_2, \ldots, ps\_m)$), for some m>0.

The importance of this construction is that Predicate $A\_sb$ of an assignment of values to the variables $psb\_1, psb\_2, \ldots psb\_k$ of the State Bin model is TRUE exactly when there is an assignment of values to the variables $ps\_1, ps\_2, \ldots ps\_u$ of the Composite Circuit model that makes the Predicate, A, TRUE.

The Generalized Predicate Mapping technique can be viewed as an extension of concepts in the Ph.D. thesis of David E. Long, entitled "*Model Checking, Abstraction, and Compositional Verification*", July 1993, CMU-CS-93-178, from Carnegie-Mellon University. In the dissertation, David Long discusses a general technique of Predicate mapping in that work, albeit one intended for a different purpose than that of SBCC.

There is a also a well-known optimization which applies when performing existential quantification of a conjunction of Predicates, such as we do in steps 126 through 130, above. This optimization has to do with interleaving the existential quantification with the conjunction of the Predicates. It is described in J. R. Burch, E. M. Clarke, D. E. Long, K. L. McMillan, and D .L. Dill, "*Symbolic Model Checking for Sequential Circuit Verification*", IEEE Transactions on Computer-Aided Design of Integrated Circuits and Systems, pp. 401–424, Vol. 13, No. 4, April 1994, incorporated herein by reference. This optimization is used to keep the sizes of BDDs smaller than performing the operations without interleaving, such as we have described them above. This optimization is consistent with our invention, and is our preferred method.

FIG. 6 is a flow chart, indicating two alternative execution paths of the invention described herein, with respect to calculating the set of Reachable State Bins. Since the set of allowable State Bin transitions is found using the set of Reachable State Bins, the calculation of allowable State Bin transitions is affected, as well. One execution path calculates the Reachable State Bins exactly, the other approximately. The exact calculation has already been described in detail in FIG. 4, and is shown here (in different format) only for the sake of comparison. The approximate technique may overestimate the set of Reachable State Bins and, therefore, also overestimate the number of allowable State Bin transitions. The reason the approximate technique is useful is that it is quite common for BDD representations such as SBCC builds to run into memory storage problems (i.e., lack of sufficient storage) and/or CPU usage problems (i.e., excessive usage of CPU time). The approximate technique will, in general, use less of these resources. It is a useful alternative when the exact calculation (outlined in FIG. 4) cannot be accomplished on a given computer system.

Since the approximate technique can result in an overestimation of the number of Reachable State Bins, if a comparison to simulation traces 40 shows a sufficiently high coverage, the user may be satisfied, and be secure in the knowledge that, although exact coverage is not known, it is known that the coverage is very high.

The discussion immediately following is intended to clarify the nature of Predicates referred to in FIG. 6. The details of FIG. 6 are discussed afterwards. We have chosen to simplify the nature of the Predicates referred to in FIG. 6 by not considering primary inputs, as was the case in the discussion of FIG. 5.

The meaning of "Composite Circuit model" and "State Bin model" are as defined above, relative to the discussion of FIG. 5.

Let PS be a vector of 'n' (n>0) present state variables, $ps\_1, ps\_2, \ldots, ps\_n$, of the Composite Circuit model.

Let NS be a vector of 'n' next state variables, $nx\_1, nx\_2, \ldots, nx\_n$ of the Composite Circuit model. These vectors represent values on Memory Elements of the Composite Circuit, the present state variables representing values at some current time step and the next state variables representing values at a next time step. Thus, the i-th variables in these vectors, $ps\_i$ and $ns\_i$, represent a present value and a value holding after some next clock event, on some particular Composite Circuit Memory Element.

Let PSB be a vector of 'm' (m>0) present variables of the State Bin model, and NSB a vector of 'm' next variables of the State Bin model. The reason these variables are referred to as 'present' and 'next', and not 'present state' and 'next state', is as follows. Variables in the State Bin model represent nodes in the Partition Set, and these can be outputs of either combination logic or Memory Elements. It is not consistent with our definition of state in a digital circuit to describe outputs of combination elements as having state, either a 'present state' or a 'next state'. Only Memory Elements can hold state in our model of a digital circuit. We do, however, differentiate between a set of 'present' and 'next' variables in the State Bin model, in that since Combinational logic elements depend upon Composite Circuit Memory Elements supplying values at their inputs, Combinational logic outputs change value (in a zero-delay model, such as we use) on clock events which cause the Memory Elements driving them to change value. Thus, the PSB variables denote values holding currently on nodes in the Partition Set, and the NSB variables denote values holding after the next time step (i.e., next, next clock event) on these nodes.

Let the Initial State Set of the Composite Circuit be represented by the Predicate Init(PS). I.e., Init(PS) is the characteristic function of the set of all valid Initial States of the Composite Circuit Memory Elements represented in the vector, PS.

Let the transition relation STR(PS, NS) represent the State Transition Relation of the Composite Circuit model. I.e., STR(PS, NS) is the characteristic function of the set of all pairs of states, the first representing a present state, the other a next state, such that a transition from the present state to the next state value is possible, in the Composite Circuit, in exactly one time step.

Finally, let Reach(PS) represent the Reachable State Set, i.e., those states reachable from the states in the Initial State Set (represented by Init(PS)) of the Composite Circuit model.

FIG. 6 describes two ways to compute the set of Reachable State Bins of the State Bin model, Reach_sb(PSB). The first is an exact method, and is explained in fuller detail in FIG. 4. It is 'exact' to the extent that the Environment Circuit actually models the real environment of the Target Circuit, and does not contain errors, and the Predicate Init(PS) correctly characterizes the set of actual Initial States of the real Composite Circuit. FIG. 6 has a double horizontal line running through it. This line symbolizes the division between the Composite Circuit model (above the line) and the State Bin model (below the line). Crossing the line is always done from top to bottom, and a crossing is effected by using the Generalized Predicate Mapping procedure described in FIG. 5. Arcs in FIG. 6 are labeled with a circled A or a circled E. The circled A denotes the path of the approximate method, the circled E, of the exact method.

In the exact calculation of Reach_sb(PSB), the first step is to compute the set of reachable states, Reach(PS). This reachability analysis is performed by manipulating BDD representations of the Initial State set and State Transition Relation, Init(PS) and T(PS,NS) respectively, as described in step 92 of FIG. 4.

This computation is represented by the arcs from steps 140 to 142 to 144, these arcs symbolizing that the BDD representations of Init(PS) and STR(PS, NS) are used to obtain the BDD representation of Reach(PS). We then use the Generalized Predicate Mapping procedure (see FIG. 5) to compute Reach_sb(PSB) from Reach(PS). This is represented by the arc from 144 to 150. This is the most accurate way of computing the Reachable State Bin set. If there is an assignment of values to the PSB State Bin variables that makes Reach_sb(PSB) true, then we are guaranteed that for each assignment of values to variables in the PSB vector of Reach_sb(PSB), there is at least one sequence of state transitions from a valid Initial State of the Composite Circuit, i, to some reachable state of the Composite Circuit, s, such that that assignment of values to the PSB State Bin model is consistent with state s.

By 'consistent' we mean here that when the Composite Circuit is in states, the values on the nodes of the Partition Set 38 will correspond to the assignment of values to the variables in the PSB vector representing those nodes.

The disadvantage of the exact calculation is that calculation of the reachable state set, Reach(PS), for the Composite Circuit may too complex, and absorb too much computer memory and CPU time, to be practical.

An alternative, approximate calculation of the set represented by Reach_sb(PSB) is possible. It will, in general, be more efficient in terms of computer memory and CPU time. Also, the approximated set of Reachable State Bins is guaranteed to be a superset of the actual set of Reachable State Bins. It may include State Bins which are not, in fact, reachable, and this is its drawback—but, it will never omit a State Bin which is reachable.

This approximate calculation is made as follows: first the BDD of the characteristic function of the set of Initial State Bins, Init_sb(PSB), is calculated from Init(PS), by the Generalized Mapping Procedure of FIG. 5. This is symbolized by the are from 140 to 146. Then the State Bin Transition Relation BDD representation, SBTR(PSB, NSB), is calculated from the State Transition Relation BDD representation, STR(PS, NS), by the Generalized Mapping Procedure of FIG. 5. This is represented by the arc from 142 to 148. Then using Init_sb(PSB) and SBTR(PSB, NSB), the set of Reachable State Bins is calculated, Reach_sb(PSB). This is represented by the arcs from 146 to 148 to 150. This is done, as was the case for manipulating Init(PS) and STR(PS, NS) above, by the techniques referenced in step 92 of FIG. 4.

In both the exact and approximate methods, the BDD for Reach_sb(PSB) is used to delete from the BDD for SBTR (PSB, NSB) transitions among unreachable State Bins. This is done as outlined in step 98 of FIG. 4. However, since in the approximate method the set represented by Reach_sb (PSB) may represent some State Bins which are not, in fact, reachable, step 98, while possibly eliminating some unreachable State Bins from SBTR(PSB, NSB), may not eliminate all of them. When doing the exact calculation, on the other hand, step 98 will result in removal of all transitions among unreachable State Bins.

FIG. 7 illustrate the procedure for finding the set of Composite Circuit Memory Elements upon which the nodes in the Partition Set 38 depend. This procedure is invoked at step 86 of FIG. 4, if user options 44 dictate.

The routine is started in step 158. In step 160, BDD representations of the functions implemented at each node of the Partition Set 38 are built. These functions will be in terms of Composite Circuit Memory Elements and, perhaps, primary circuit inputs. This set of BDDs is called the Partition Function Set. In step 162, a set of Composite Circuit Memory Element names, called the Dependency Set, is created and the names of all Memory Elements appearing as arguments to the functions in the Partition Function Set are put into the Dependency Set. Since it may prove useful in a program optimization, a copy of the Dependency Set, at this step, can be preserved, and we show this being called the First Dependency Set. In addition, in step 160, a set called the Function Set is initialized to the null (empty) set.

In step 164, a loop begins. Step 164 is a decision point. If there exists a Composite Circuit Memory Element described as an "Unrecorded Element", then several actions are taken (steps 166 and 168). An "Unrecorded Element" is a Composite Circuit Memory Element named in the Dependency Set, but which does not have a function in the Function Set representing the function at its input. If there is not any such "Unrecorded Element", the routine is exited, step 170, the Dependency Set containing the names of all Memory Elements upon which the nodes in the Partition Set 38 have a dependence, the Function Set containing the functions implemented at the inputs of all those Memory Elements (and, thus, the main ingredient for building the Next State Functions described in step 86, FIG. 4), and the Partition Function Set containing the functions implemented at all the nodes of the Partition Set (and, thus, the main ingredient for the Predicates, P_i, built in step 124, FIG. 5).

If an "Unrecorded Element" does exist, then in step 166 a BDD representation of the function at the input to this Memory Element is built, and inserted into the Function Set, and, in addition, the support of this function is examined and the names of Composite Circuit Memory Elements are added to the Dependency Set, step 168, if (a) the name is not already in the Dependency Set, and (b) a variable representing the named Composite Circuit Memory Element is present in the support of said function.

The creation of a First Dependency Set in step 162 is useful for the optimization of interleaving existential quantification and conjunction, referred to above relative to step 130 of FIG. 6. The Memory Elements in the First Dependency Set are the Memory Elements upon which the nodes in the Partition Set have a direct dependence. In step 96, variables in the State Transition Relation BDD representing Memory Elements not in the First Dependency Set may be existentially quantified away right at the beginning, before applying the Generalized Mapping Procedure of FIG. 5.

Those skilled in the art will recognize that modifications and variations can be made without departing from the spirit of the invention. Therefore, it is intended that this invention encompass all such variations and modifications as fall within the scope of the appended claims.

We claim:

1. A method for transforming Representations of a Finite State Machine (FSM) model into State Bin Representations, said method comprising the steps of:

(A) building a State Transition Relation Representation of a subset of Composite Circuit Memory Elements, wherein:
   the State Transition Relation Representation is stored in at least one data structure in a Memory;

(B) performing Reachability Analysis to build a Reachable State Set Representation stored in at least one data structure in the Memory, wherein:
   the Reachability Analysis utilizes the State Transition Relation Representation and an Initial State Set Representation to build the Reachable State Set Representation, and
   the Reachable State Set Representation is a representation of all reachable states of the subset of Composite Circuit Memory Elements; and (C) transforming the Reachable State Set Representation into a Reachable State Bin Set Representation stored in at least one data structure in the Memory and the State Transition Relation Representation into a State Bin Transition Relation Representation stored in at least one data structure in the Memory, wherein:
   the Reachable State Bin Set Representation represents a Reachable State Bin Set, and
   the State Bin Transition Relation Representation represents a State Bin Transition Relation.

2. The method in claim 1 which further comprises the steps of:

(D) specifying an Environment Circuit Model to model an Environment Circuit; and (E) specifying a Target Circuit Model to model a Target Circuit, wherein:
the Environment Circuit and the Target Circuit combined form a Composite Circuit,
the Environment Circuit Model and the Target Circuit Model combined form a Composite Circuit Model,
the Composite Circuit include one or more Composite Circuit Memory Elements,
the Target Circuit Model has one or more Target Circuit Model Input Signals, and
the Environment Circuit Model provides all of the one or more Target Circuit Model Input Signals.

3. The method in claim 2 which further comprises the step of:
(F) specifying an Initial State Set for the Composite Circuit, wherein:
the Initial State Set is comprised of Finite State Machine (FSM) states, and
only those FSM states in the Initial State Set are allowable starting states for the Composite Circuit Model.

4. The method in claim 3 which further comprises the step of:
(G) building a representation of the Initial State Set in the Memory.

5. The method in claim 4 wherein step (G) comprises the substeps of:
(1) building representations of predicates returning values of valid initial values for each of the Composite Circuit Memory Elements, and
(2) building a representation for storage in the Memory of a conjunction of all the predicates built in substep (1).

6. The method in claim 2 which further comprises the step of:
(F) specifying a Partition Set with a Partition Set Specification, wherein:
the Partition Set includes one or more nodes in the Target Circuit.

7. The method in claim 2 which further comprises the step of:
(F) identifying one or more Memory Elements in the Composite Circuit.

8. The method in claim 2 which further comprises the step of:
(F) selecting a Composite Circuit Memory Element Subset which is a subset of the Composite Circuit Memory Elements for representation in a data structure for storage in the Memory.

9. The method in claim 8 wherein step (F) comprises the substeps of:
(1) building a Partition Function Set Representation, which is a representation of a set of functions, wherein:
each node in a Partition Set is represented by a member of the set of functions,
(2) identifying as Identified Composite Circuit Memory Elements the Composite Circuit Memory Elements upon which the Partition Function Set Representation depends,
(3) building representations of a function implemented at an input of each of the Identified Composite Circuit Memory Elements unless already built in substep (1),
(4) identifying Composite Circuit Memory Elements for which no function representation has been built,
(5) building a function representation for each Composite Circuit Memory Elements identified in substep (4), and
(6) repeating substeps (4) and (5) until no more Composite Circuit Memory Elements are identified in substep (4).

10. The method in claim 8 which further comprises the step of:
(G) building representations for storage in the Memory of a Next State Function for each member of the subset of Composite Circuit Memory Elements.

11. The method in claim 2 wherein within step (E):
the Target Circuit Model has zero or more Target Circuit Model Output Signals, and
the Environment Circuit receives the zero or more Target Circuit Model Output Signals.

12. The method in claim 11 wherein:
the Environment Circuit Model provides feedback interactions between one or more of the Target Circuit Model Output Signals and one or more of the Target Circuit Model Input Signals.

13. The method in claim 2 wherein step (C) comprises the substep of:
(1) mapping all predicates over variables representing Composite Circuit Memory Elements into predicates over variables representing nodes in a Partition Set.

14. The method in claim 13 wherein substep (1) comprises the subsubsteps of:
(a) instantiating a variable for each of one or more nodes in the Partition Set,
(b) forming a set of predicates containing one or more predicates, wherein:
each node in the Partition Set corresponds to one of the predicates,
each predicate is an XNOR of the variable instantiated in subsubstep (a) for a corresponding node and a function implemented at the corresponding node,
(c) forming a conjunction of all predicates formed in subsubstep (b),
(d) forming a conjunction of a predicate formed in subsubstep (c) with a predicate over variables representing Composite Circuit Memory Elements a transformation of which is desired, and
(e) existentially quantifying all variables representing Composite Circuit Memory Elements out of the predicate formed in subsubstep (d).

15. The method in claim 14 wherein step (C) further comprises the substeps of:
(2) mapping the Reachable State Set Representation to the Reachable State Bin Set Representation comprising the same subsubsteps as substep (1);
(3) mapping the State Transition Relation Representation into the State Bin Transition Relation Representation comprising the same subsubsteps as substep (1); and
(4) deleting representations of unreachable State Bins from the State Bin Transition Relation Representation.

16. The method in claim 15 wherein substep (4) comprises the subsubstep of:
(a) Intersecting the State Bin Transition Relation Representation with two copies of a representation of Reachable State Bins, wherein:
one of the two copies has one or more variables renamed as Present Value variables, and
the other of the two copies has one or more variables renamed as Next Value Variables.

17. The method in claim 13 wherein step (C) further comprises the substep of:
(2) finding an approximation to the Reachable State Bin Set.

18. The method in claim 17 wherein substep (2) comprises the subsubsteps of:
  (a) mapping an Initial State Set Representation into an Initial State Bin Set Representation;
  (b) mapping the State Transition Relation Representation into a State Bin Transition Relation Representation;
  (c) performing Reachability analysis using the Initial State Bin Set Representation and the State Bin Transition Relation Representation in order to build a representation of an approximation to the Reachable State Bin Set, said approximation being a superset of the Reachable State Bin Set; and
  (d) deleting representations of unreachable State Bins from the State Bin Transition Relation Representation.

19. The method in claim 18 wherein substep (4) comprises the subsubstep of:
  (a) Intersecting The State Bin Transition Relation Representation with two copies of a representation of Reachable State Bins, wherein:
    one of the two copies has one or more variables renamed as Present Value variables, and
    the other of the two copies has one or more variables renamed as Next Value Variables.

20. The method in claim 2 wherein within step (D):
  the Environment Circuit Model is a non-deterministic Finite State Machine (FSM).

21. The method in claim 1 which further comprises the step of:
  (D) specifying a Simulation Trace Set containing one or more Simulation Traces for which simulation coverage is to be measured.

22. The method in claim 21 which further comprises the step of:
  (E) calculating Simulation Coverage of the Simulation Traces, wherein:
    the Simulation Coverage is an extent to which the Simulation Traces exhibit visitations to Reachable State Bins and an extent to which the Simulation Traces exhibit taking allowable transitions among Reachable State Bins.

23. The method in claim 21 wherein step (D) comprises the substeps of:
  (1) traversing the Reachable State Bin Set Representation to obtain a list of all Reachable State Bins;
  (2) traversing the State Bin Transition Relation Representation to obtain a list of all allowable transitions among Reachable State Bins;
  (3) measuring from Simulation Trace data a number of occurrences of visitations to each of the Reachable State Bins;
  (4) measuring from the Simulation Trace data a number of occurrences of each allowable transition among Reachable State Bins in the list of all allowable transitions among Reachable State Bins; and
  (5) outputting of statistics derived from substeps (3) and (4).

24. The method in claim 1 wherein within step (A):
  the State Transition Relation Representation is built using Binary Decision Diagrams (BDDs).

25. The method in claim 1 wherein within step (B):
  the Reachable State Set Representation is built using Binary Derision Diagrams (BDDs).

26. The method in claim 1 wherein within step (C):
  the Reachable State Bin Set Representation and the State Bin Transition Relation Representation are built using Binary Decision Diagrams (BDDs).

27. A method for measuring an extent to which a Finite State Machine implemented as a Target Circuit has been tested via simulation, wherein:
  the Target Circuit combined with an Environment Circuit form a Composite Circuit,
said method comprising the steps of:
  (A) specifying an Environment Circuit Model to model the Environment Circuit;
  (B) specifying a Target Circuit Model to model the Target Circuit, wherein:
    the Environment Circuit Model and the Target Circuit Model combined form a Composite Circuit Model,
    the Composite Circuit include one or more Composite Circuit Memory Elements,
    the Target Circuit Model has one or more Target Circuit Model Input Signals, and
    the Environment Circuit Model provides all of the one or more Target Circuit Model Input Signals;
  (C) specifying an Initial State Set for the Composite Circuit, wherein:
    the Initial State Set is comprised of Finite State Machine (FSM) states, and
    only those FSM states in the Initial State Set are allowable starting states for the Composite Circuit Model;
  (D) specifying a Partition Set with a Partition Set Specification, wherein:
    the Partition Set includes one or more nodes in the Target Circuit;
  (E) specifying a Simulation Trace Set containing one or more Simulation Traces for which simulation coverage is to be measured;
  (F) identifying the Composite Circuit Memory Elements;
  (G) selecting a Composite Circuit Memory Element Subset which is a subset of the Composite Circuit Memory Elements for representation in a data structure for storage in the Memory;
  (H) building a representation of the set of Initial States for the Composite Circuit Memory Element Subset;
  (I) building representations for storage in the Memory of a Next State Function for each member of the subset of Composite Circuit Memory Elements;
  (J) building a State Transition Relation Representation of a subset of Composite Circuit Memory Elements, wherein:
    the State Transition Relation Representation is stored in at least one data structure in a Memory;
  (K) performing Reachability Analysis to build a Reachable State Set Representation stored in at least one data structure in the Memory, wherein:
    the Reachability Analysis utilizes the State Transition Relation Representation and an Initial State Set Representation to build the Reachable State Set Representation, and
    the Reachable State Set Representation is a representation of a set of reachable states of a subset of Composite Circuit Memory Elements;
  (L) transforming the Reachable State Set Representation into a Reachable State Bin Set Representation stored in at least one data structure in the Memory and the State Transition Relation Representation into a State Bin Transition Relation Representation stored in at least one data structure in the Memory, wherein:
    the Reachable State Bin Set Representation represents a Reachable State Bin Set, and the State Bin Transition Relation Representation represents a State Bin Transition Relation; and (M) calculating Simulation Coverage of the Simulation Traces, wherein:
the Simulation Coverage is an extent to which the Simulation Traces exhibit visitations to Reachable State Bins and an extent to which the Simulation Traces exhibit taking allowable transitions among Reachable State Bins.

* * * * *